(12) United States Patent
Etoh et al.

(10) Patent No.: US 11,664,185 B2
(45) Date of Patent: May 30, 2023

(54) VIBRATION DAMPING SYSTEM FOR CHARGED PARTICLE BEAM APPARATUS

(71) Applicant: Hitachi High-Tech Corporation, Tokyo (JP)

(72) Inventors: Jun Etoh, Tokyo (JP); Hironori Ogawa, Tokyo (JP); Shuichi Nakagawa, Tokyo (JP); Terunobu Funatsu, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 37 days.

(21) Appl. No.: 17/536,223

(22) Filed: Nov. 29, 2021

(65) Prior Publication Data
US 2022/0208505 A1 Jun. 30, 2022

(30) Foreign Application Priority Data
Dec. 25, 2020 (JP) .............................. JP2020-217285

(51) Int. Cl.
*H01J 37/02* (2006.01)
*B06B 1/02* (2006.01)
*H03G 3/20* (2006.01)

(52) U.S. Cl.
CPC .......... *H01J 37/023* (2013.01); *B06B 1/0253* (2013.01); *B06B 2201/30* (2013.01); *H01J 2237/0216* (2013.01); *H03G 3/20* (2013.01)

(58) Field of Classification Search
CPC ............ H01J 37/023; H01J 2237/0216; B06B 1/0253; B06B 2201/30; H03G 3/20
See application file for complete search history.

(56) References Cited

U.S. PATENT DOCUMENTS

| 10,591,018 | B2 * | 3/2020 | Takahashi | ............... G03F 7/709 |
| 2019/0214224 | A1 * | 7/2019 | Kawaguchi | ........... F16F 15/007 |
| 2019/0311876 | A1 * | 10/2019 | Shigeoka | ................ H01J 37/18 |

FOREIGN PATENT DOCUMENTS

| EP | 3163597 A1 * | 5/2017 | .............. H01J 37/20 |
| JP | 2006153129 A * | 6/2006 | |
| JP | 2017163083 A * | 9/2017 | |
| WO | 2018/020625 A1 | 2/2018 | |

\* cited by examiner

*Primary Examiner* — David E Smith
(74) *Attorney, Agent, or Firm* — Mattingly & Malur, PC (57) ABSTRACT

A vibration damping system for a charged particle beam apparatus according to the present invention includes a column through which a charged particle beam passes, a vibration detection unit that detects vibration of the column, a damping mechanism that applies vibration to the column to suppress the vibration of the column, and a control device that controls the damping mechanism. The control device includes a damping gain control unit that amplifies a detection signal of the vibration detection unit with a set amplification factor and outputs an amplified detection signal as a control signal to the damping mechanism, and a saturation suppression unit that adjusts a feedback gain value of the damping gain control unit according to a detection signal of the vibration detection unit, a signal of the damping mechanism, and a maximum output value and a minimum output value of the damping mechanism.

5 Claims, 7 Drawing Sheets

VIBRATION DAMPING SYSTEM FOR CHARGED PARTICLE BEAM APPARATUS

CROSS-REFERENCE TO RELATED APPLICATION

The present application claims priority from Japanese application JP 2020-217285, filed on Dec. 25, 2020, the contents of which is hereby incorporated by reference into this application.

BACKGROUND OF THE INVENTION

1. Field of the Invention

The present invention relates to a vibration damping system for a charged particle beam apparatus such as a scanning electron microscope.

2. Description of the Related Art

With the miniaturization of semiconductor elements in recent years, improvement in resolution and throughput is required in charged particle beam apparatuses such as electron beam lithography apparatuses and SEM-type wafer inspection apparatuses. In order to further increase the resolution and function, it is necessary to add a correction device to the optical system of the electron beam.

However, there is a problem that the addition of a correction device increases the size of the column of the charged particle beam apparatus and decreases the rigidity of the column. When the stage is accelerated to increase the throughput, a driving reaction force during the stage operation increases, and an exciting force to the device increases. A decrease in rigidity of the column due to an increase in size of the column and an increase in driving reaction force due to a high acceleration of the stage cause an increase in vibration of the column.

As a new method for suppressing column vibration, an active vibration damping system that suppresses column vibration using a sensor and an actuator has been studied. During operation of the apparatus, large and small disturbances are applied to the column, and thus a high-output actuator capable of damping vibration even against large disturbances is required. However, it is necessary to avoid an increase in size of an electromagnetic actuator that affects an electron source (charged particle source) or an actuator that affects column vibration, and thus it is difficult to prepare a high-output actuator. When a large disturbance exceeds the maximum output value of the damping mechanism, the frequency component not to be controlled increases, and the damping effect cannot be sufficiently obtained. Therefore, in order to obtain the maximum effect according to the performance of the damping mechanism, it is necessary to adjust the feedback gain with respect to each disturbance.

As a method for adjusting the feedback gain according to the situation of such an apparatus, WO 2018/020625 discloses a charged particle beam apparatus that changes the feedback gain of feedback control according to a command of an operation sequence of the charged particle beam apparatus. Specifically, WO 2018/020625 describes a charged particle beam apparatus that changes a feedback gain of feedback control in accordance with a command of an operation sequence of the charged particle beam apparatus.

In the gain adjustment method disclosed in WO 2018/020625, even if the vibration becomes small, the gain has a constant value unless there is a gain adjustment signal from the device, so that the maximum damping effect cannot be obtained at each time. Since variation in disturbance in each sequence of the device cannot be considered, there is a possibility that the maximum output of the damping mechanism is exceeded.

SUMMARY OF THE INVENTION

The present invention has been made in view of the above problems, and an object of the present invention is to provide a vibration damping system for a charged particle beam apparatus capable of performing appropriate damping control according to the situation of the device and the performance of the damping mechanism.

A vibration damping system for a charged particle beam apparatus according to the present invention includes a column through which a charged particle beam passes, a vibration detection unit that detects vibration of the column, a damping mechanism that applies vibration to the column to suppress the vibration of the column, and a control device that controls the damping mechanism. The control device includes a damping gain control unit that amplifies a detection signal of the vibration detection unit with a set amplification factor and outputs an amplified detection signal as a control signal to the damping mechanism, and a saturation suppression unit that adjusts a feedback gain value of the damping gain control unit according to a detection signal of the vibration detection unit, a signal of the damping mechanism, and a maximum output value and a minimum output value of the damping mechanism.

According to the present invention, it is possible to provide the vibration damping system for the charged particle beam apparatus capable of performing appropriate damping control according to the situation of the device and the performance of the vibration damping mechanism.

BRIEF DESCRIPTION OF THE DRAWINGS

FIG. 5 is a graph comparing an estimated value (207) of the instantaneous amplitude of the column collapse primary mode at each time calculated by an instantaneous amplitude calculation unit 25b with a signal (202) generated by the filter processing unit 25a;

DESCRIPTION OF THE PREFERRED EMBODIMENTS

Hereinafter, embodiments of the invention will be described with reference to the accompanying drawings. In the accompanying drawings, the elements having the same function may be attached with the same symbol. Further, the accompanying drawings illustrate embodiments according to the principle of the disclosure in order to help with understanding of the disclosure, but the disclosure is not interpreted in a limited way. The description of this specification is given only as a typical example, and does not limit the scope of claims or applications of the disclosure.

In this embodiment, the explanation has been made in detail sufficiently for a person skilled in the art to implement the disclosure while other mounting/embodiments may be possible. It is necessary to understand that changes in configuration/structures and replacements of various elements may be implemented without departing from the scope of the technical ideas and the spirit of the disclosure. Therefore, the following description must not be interpreted in a limited way.

First Embodiment

A vibration damping system (vibration suppression system) for a charged particle beam apparatus according to a first embodiment and a charged particle beam apparatus including such a vibration damping system will be described with reference to FIG. 1 and the like.

Figure 1:
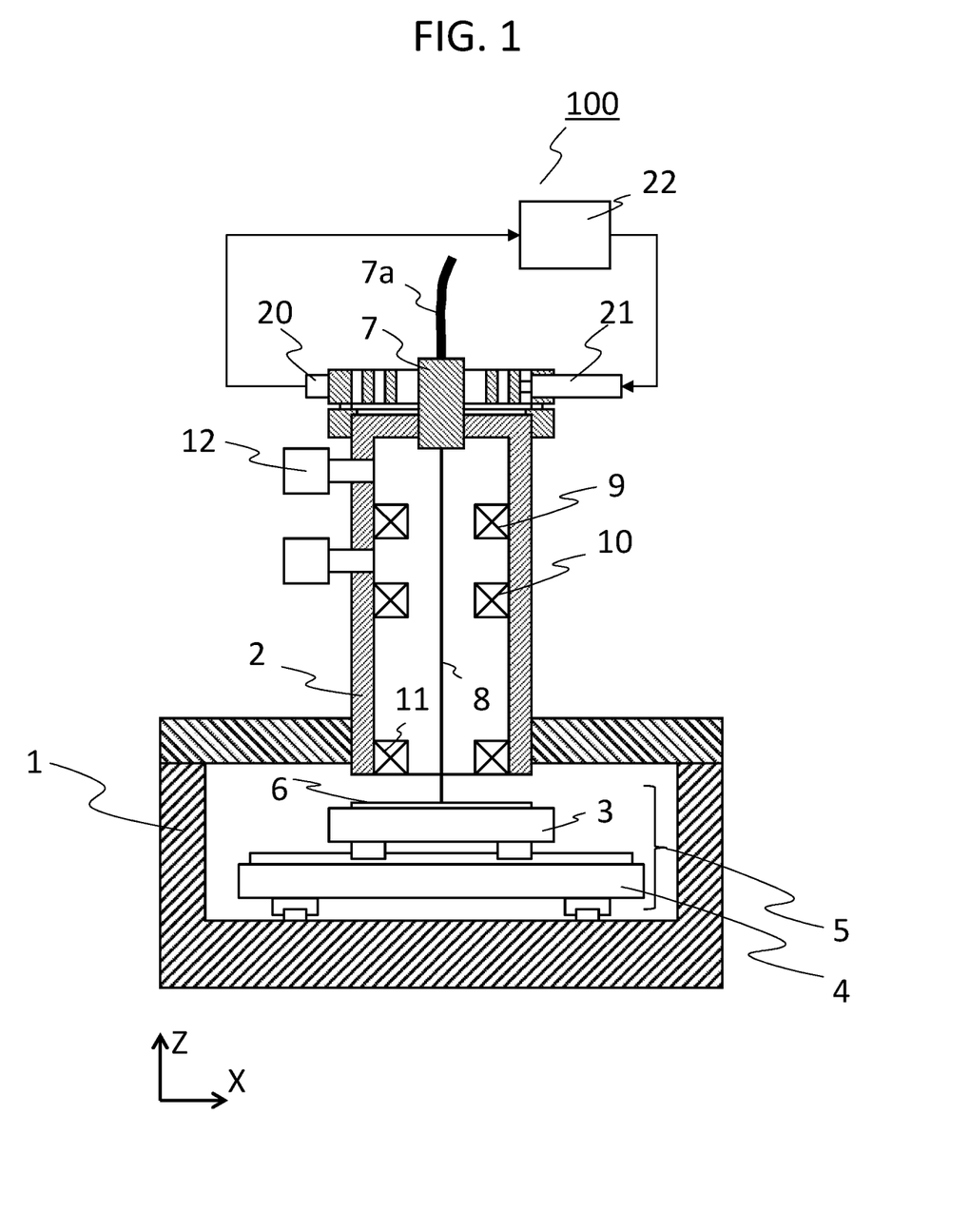
FIG. 1 is a schematic diagram illustrating a vibration damping system (vibration suppression system) for a charged particle beam apparatus according to a first embodiment and a charged particle beam apparatus including such a vibration damping system.

FIG. 1 is a sectional view illustrating an example of a charged particle beam apparatus 100 according to a first embodiment. The charged particle beam apparatus 100 includes a sample chamber 1 and a column 2 installed above the sample chamber 1.

A sample stage 5 including an X table 3 movable in the X direction and a Y table 4 movable in the Y direction is provided inside the sample chamber 1. A sample 6 is placed on the sample stage 5.

The inside of the sample chamber 1 is maintained in a vacuum state by a turbo molecular pump and a dry pump (not illustrated). An electron gun 7 is provided above the column 2, and an electron gun 7 generates a primary electron beam 8. The wiring 7a to the electron gun 7 is guided from above the electron gun 7. The column 2 includes a condenser lens 9, a scanning deflector 10, and an objective lens 11 therein. A high-voltage power source (not illustrated) is connected to the electron gun 7. The primary electron beam (electron beam) 8 emitted from the electron gun 7 is converged by the condenser lens 9 and the objective lens 11, and the sample 6 is scanned by the scanning deflector 10.

The electron beam 8 is provided with an acceleration voltage of 10 kV or more as an example. Each of the condenser lens 9 and the objective lens 11 includes an excitation coil, and the magnetic field is changed by controlling the excitation current, and the focal position of the electron beam 8 is controlled.

In addition, the column 2 is maintained in an ultrahigh vacuum state by evacuation using an ion pump 12. A vibration sensor 20 (vibration detection unit) and a vibration damping mechanism 21 are provided above the column 2. The control device 22 drives the vibration damping mechanism 21 based on a signal from the vibration sensor 20. Even when the column 2 is enlarged and its rigidity is reduced, vibration is suppressed by the vibration damping mechanism 21.

Figure 2:
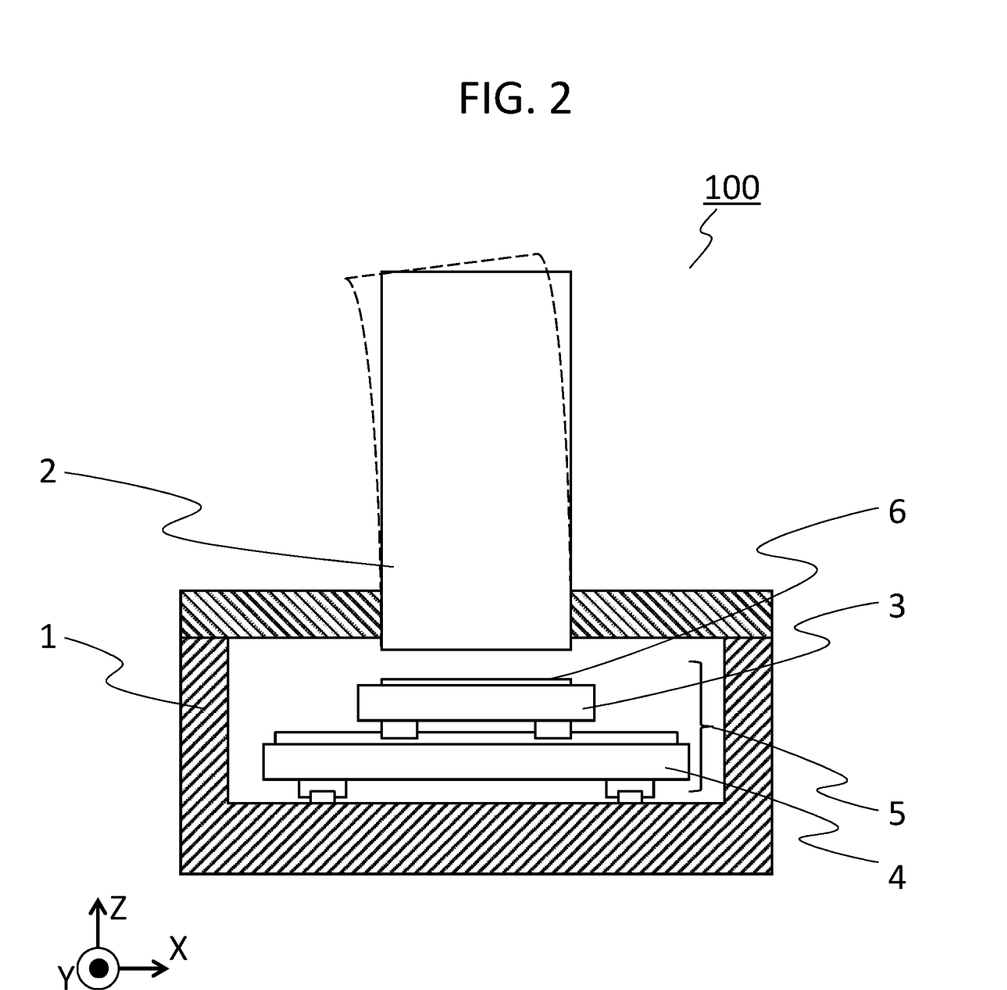
FIG. 2 is a diagram illustrating a vibration mode of a column 2 to be damped by a charged particle beam apparatus 100 according to the first embodiment.

FIG. 2 is a diagram illustrating a vibration mode of the column 2 to be damped by the charged particle beam apparatus 100. In the charged particle beam apparatus 100, the column 2 vibrates due to disturbance such as floor vibration and environmental noise or a transient input during stage movement, which may cause image shake during imaging. In particular, it is known that the vibration of the column 2 greatly affects the image shake in a mode in which the upper portion of the column 2 vibrates so as to fall in one direction (X direction or Y direction) (column collapse primary mode). FIG. 1 illustrates a state of vibration in the column collapse primary mode in the X direction.

Figure 3:
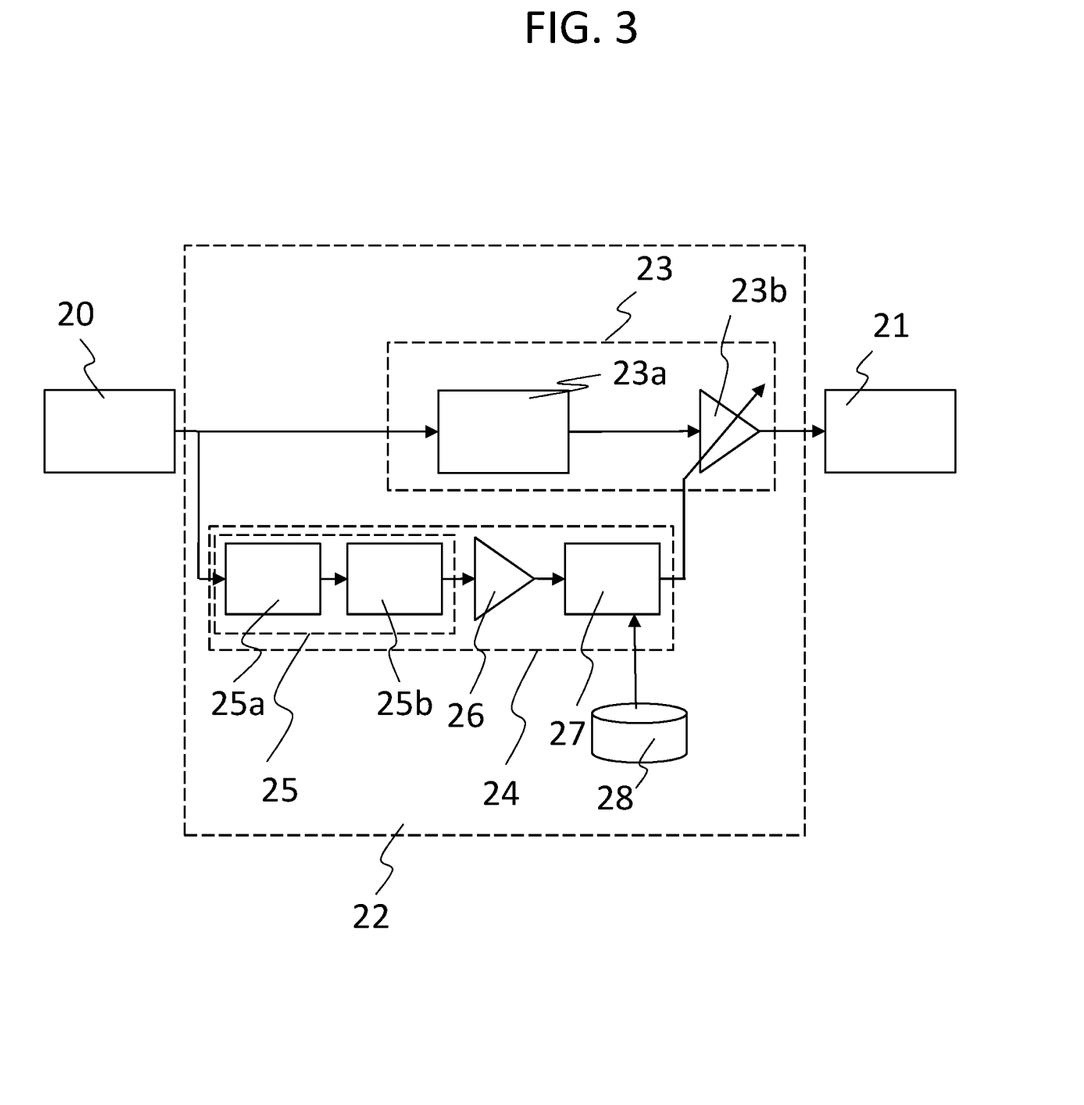
FIG. 3 is a block diagram illustrating details of a control device 22.

FIG. 3 is a block diagram illustrating details of the control device 22. The control device 22 includes a damping gain control unit 23 and a saturation suppression control unit 24 (saturation suppression unit).

The damping gain control unit 23 is a control unit that amplifies the detection signal of the vibration sensor 20 at a set amplification factor (multiplies the detection signal by a gain), outputs the amplified signal as a control signal toward the vibration damping mechanism 21, and controls the vibration damping mechanism 21. The damping gain control unit 23 further includes a controller 23a and a feedback gain control unit 23b.

The controller 23a is configured to generate a control signal for reducing the vibration of the column collapse primary mode in the column 2 based on the detection signal of the vibration sensor 20. Further, the feedback gain control unit 23b calculates an output signal to the vibration damping mechanism 21 by multiplying a gain to the control signal output from the controller 23a.

The controller 23a is designed using, for example, a plurality of digital filters (low-pass filter, high-pass filter, band-pass filter, and the like) so that the feedback control system becomes stable and the effect of reducing the vibration in the column collapse primary mode can be obtained. Further, the controller 23a can also be designed using a PID controller or other controllers. The feedback gain control unit 23b is configured to be adjustable by the saturation suppression control unit 24.

The saturation suppression control unit 24 is a control unit that adjusts a feedback gain to the damping gain control unit 23 according to a detection signal of the vibration sensor 20, a signal of the vibration damping mechanism 21, and a maximum output value and a minimum output value of the vibration damping mechanism 21 to suppress saturation of the vibration damping mechanism 21. As an example, the saturation suppression control unit 24 includes an amplitude estimation calculation unit 25, a calculation gain control unit 26, and a feedback gain value calculation unit 27.

The amplitude estimation calculation unit 25 includes the filter processing unit 25a and the instantaneous amplitude calculation unit 25b, and calculates the instantaneous amplitude of a specific vibration frequency component. Based on the detection signal of the vibration sensor 20, the filter processing unit 25a performs filtering processing of extracting only the frequency component of the column collapse primary mode, for example, using a band pass filter or the like illustrated in [Expression 1], for example.

$$(\omega/Q)s/(s^2+(\omega/Q)s+\omega^2) \quad \text{[Expression 1]}$$

Here, s is a Laplace operator, ω is an angular frequency of a column collapse primary mode, and Q is a sharpness of an extracted vibration frequency component. The angular frequency ω of the column collapse primary mode can be acquired by performing a hammering test or the like and measuring a frequency response function.

Further, the sharpness Q of the vibration frequency component is a value for setting a frequency width to be extracted. Q is an arbitrary integer of 0 or more, but the frequency width becomes narrower as the value becomes larger.

The instantaneous amplitude calculation unit 25b estimates (calculates) the instantaneous amplitude of the signal of the column collapse primary mode based on the signal (the signal of the column collapse primary mode) generated through the filter processing unit 25a. The calculation of the instantaneous amplitude when it is assumed that the signal generated by the filter processing unit 25a is a sine wave will be described. When it is assumed that the signal X generated by the filter processing unit 25a is a sinusoidal signal of the column collapse primary mode, the differential value dx/dt of the signal X and the signal in the time domain can be expressed as [Expression 2].

$$X = A \sin(\omega t)$$

$$dX/dt = A\omega \cos(\omega t) \quad \text{[Expression 2]}$$

Here, ω is the angular frequency of the column collapse primary mode, and A is the amplitude of the signal of the column collapse primary mode. The signal of the column collapse primary mode can be obtained by substituting the signal generated by the filter processing unit 25a, and the differential value of the signal in the time domain can be obtained by differentiating the signal generated by the filter processing unit 25a in the time domain.

When the amplitude A of the column collapse primary mode is solved using [Expression 2], the amplitude A can be expressed as [Expression 3].

$$A = \mathrm{sqrt}(X^2 + ((dX/dt)^2/\omega^2)) \quad \text{[Expression 3]}$$

The instantaneous amplitude of the signal of the column collapse primary mode can be estimated by substituting each value into [Expression 3].

The calculation gain control unit 26 stores a gain value for amplifying the signal of the column collapse primary mode in the controller 23a. The calculation gain control unit 26 calculates the instantaneous amplitude of the output signal to the vibration damping mechanism 21 by multiplying the instantaneous amplitude of the signal of the column collapse primary mode estimated by the amplitude estimation calculation unit 25 by the gain value.

A maximum output value/minimum output value storage unit 28 stores a maximum output value $F_{max}$ and a minimum output value $F_{min}$ of the vibration damping mechanism 21. The maximum output value $F_{max}$ and the minimum output value $F_{min}$ can be determined based on the upper limit of the output signal of the control device 22, the physical upper limit of the vibration damping mechanism 21, the output upper limit/lower limit described in the data sheet of the vibration damping mechanism 21, and the like.

The feedback gain value calculation unit 27 calculates the feedback gain value K based on the instantaneous amplitude of the output signal to the vibration damping mechanism 21 calculated by the calculation gain control unit 26 and the maximum output value $F_{max}$ and the minimum output value $F_{min}$ stored in the maximum output value/minimum output value storage unit 28. The feedback gain value calculation unit 27 calculates the feedback gain value K with which the maximum damping effect is obtained without the output value of the control device 22 exceeding the maximum output value $F_{max}$ of the vibration damping mechanism 21 or falling below the minimum output value $F_{min}$. The feedback gain value K generated by the feedback gain value calculation unit 27 is sequentially updated at each time and supplied to the feedback gain control unit 23b, so that the feedback gain control unit 23b can appropriately adjust the output value.

As an example, the feedback gain value calculation unit 27 calculates the feedback gain value K as in [Expression 4]. Here, $F_{est}$ is the instantaneous amplitude of the output signal to the vibration damping mechanism 21 calculated by the calculation gain control unit 26. That is, the feedback gain value calculation unit 27 has a role of adjusting the feedback gain value K according to the magnitude relationship between the absolute value of the difference between the maximum output value $F_{max}$ and the minimum output value $F_{min}$ of the vibration damping mechanism 21 and the instantaneous amplitude of the output signal to the vibration damping mechanism 21.

$$K = 1 \text{ (in the case of } |F_{max} - F_{min}|/2 > F_{est})$$

$$K = |F_{max} - F_{min}|/(2 \cdot F_{est}) \text{ (when } |F_{max} - F_{min}|/2 < F_{est}) \quad \text{[Expression 4]}$$

Figure 4A:
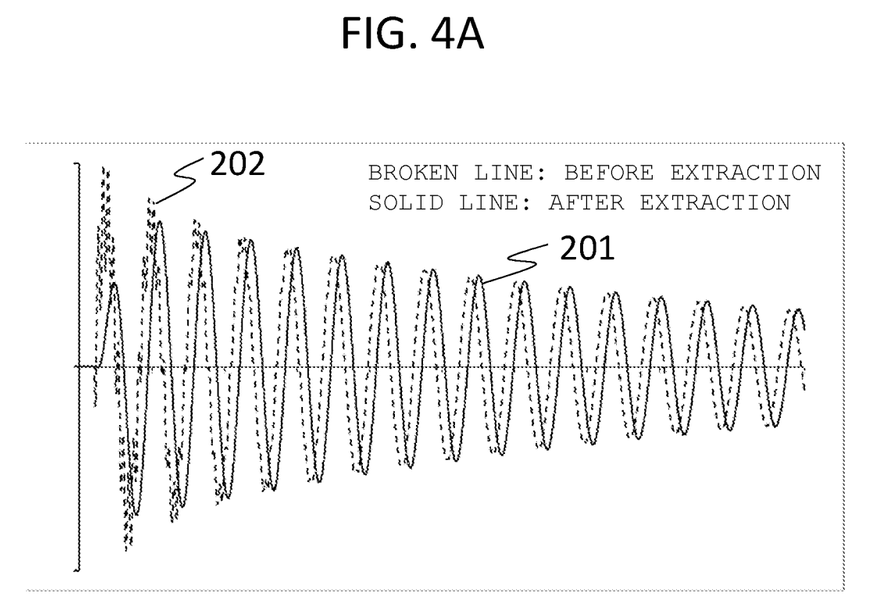
FIGS. 4A and 4B illustrate a change in a signal before and after a filter processing unit 25a extracts a signal of a predetermined frequency component of a column collapse primary mode.
Figure 4B:
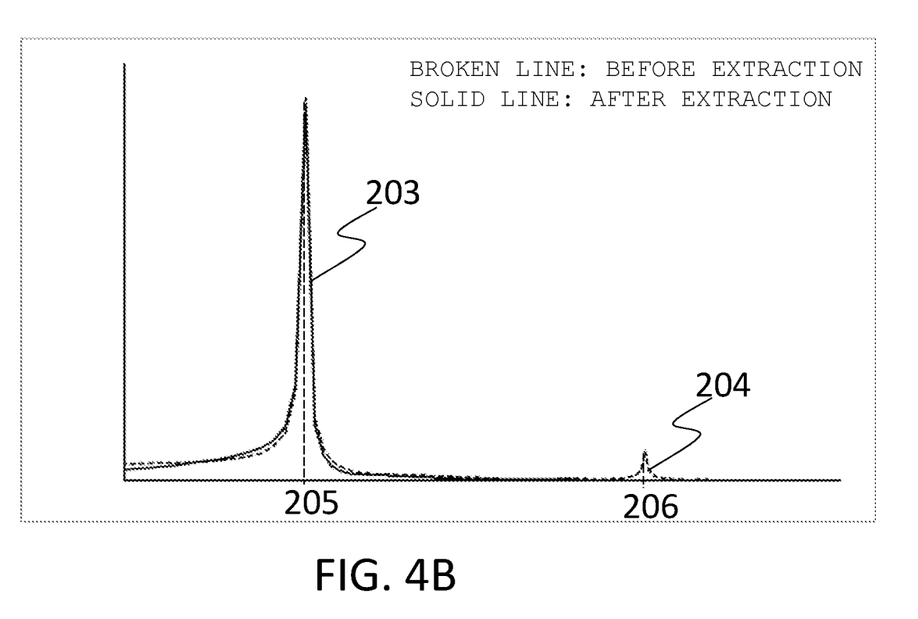

With reference to FIGS. 4A and 4B, changes in signals before and after the filter processing unit 25a extracts a signal of a predetermined frequency component of the column collapse primary mode will be described.

FIG. 4A illustrates an example of a time-series waveform 202 of the detection signal input from the vibration sensor 20 and a time-series waveform 201 of the signal of the column collapse primary mode output from the filter processing unit 25a, in which the vertical axis represents the voltage value and the horizontal axis represents time.

FIG. 4B is a waveform of the signal of FIG. 4A after Fourier transform, in which the vertical axis represents the voltage amplitude and the horizontal axis represents the frequency. From the waveform of FIG. 4B, in the spectrum waveform 204 of the detection signal output from the vibration sensor 20, the amplitude is generated even at the frequency 206 other than the frequency 205 of the column collapse primary mode, but in the spectrum waveform 203 after extracting only the signal of the column collapse primary mode, it can be seen that only the amplitude of the frequency 205 of the column collapse primary mode is generated.

Figure 5:
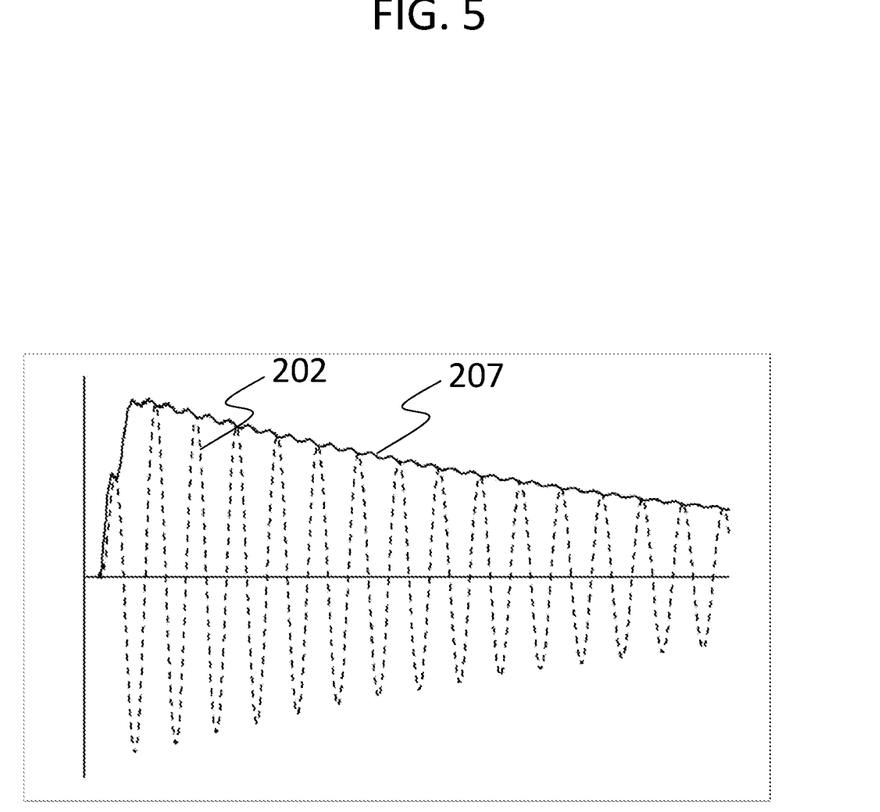

With reference to FIG. 5, the estimated value (207) of the instantaneous amplitude of the column collapse primary mode at each time calculated by the instantaneous amplitude calculation unit 25b is compared with the signal (202) generated by the filter processing unit 25a. A curve 207 in FIG. 5 indicates an estimated value of the instantaneous amplitude of the column collapse primary mode at each time calculated using [Expression 3] on the basis of the signal 201 extracted by the filter processing unit 25a. The vertical axis of the graph in FIG. 5 represents the voltage value of the signal, and the horizontal axis represents time. It can be seen that the estimated value 207 of the instantaneous amplitude of the column collapse primary mode at each time correctly estimates the actual amplitude with respect to the amplitude of the signal 202 extracted by the filter processing unit 25a.

An example of a change in the feedback gain value K calculated at each time by the feedback gain value calculation unit 27 (FIG. 6A) and a change in the output signal to the vibration damping mechanism 21 due to the change in the feedback gain value K (FIG. 6B) will be described with reference to FIGS. 6A and 6B. In FIG. 6B, a description will be made while comparing with a change in the voltage signal in a case where the adjustment by the feedback gain value K is not performed.

Figure 6A:
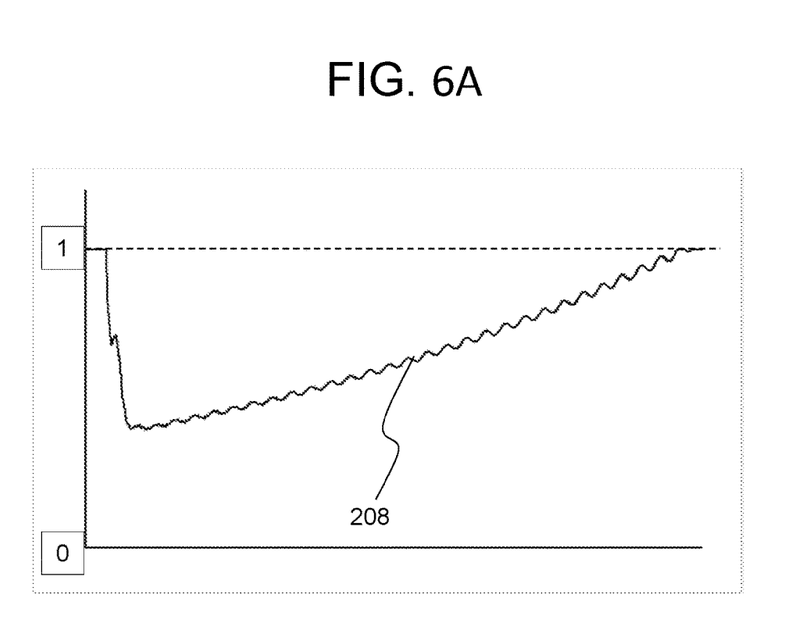
FIG. 6A is a graph illustrating an example of a change in a feedback gain value K calculated at each time by a feedback gain value calculation unit 27.
Figure 6B:
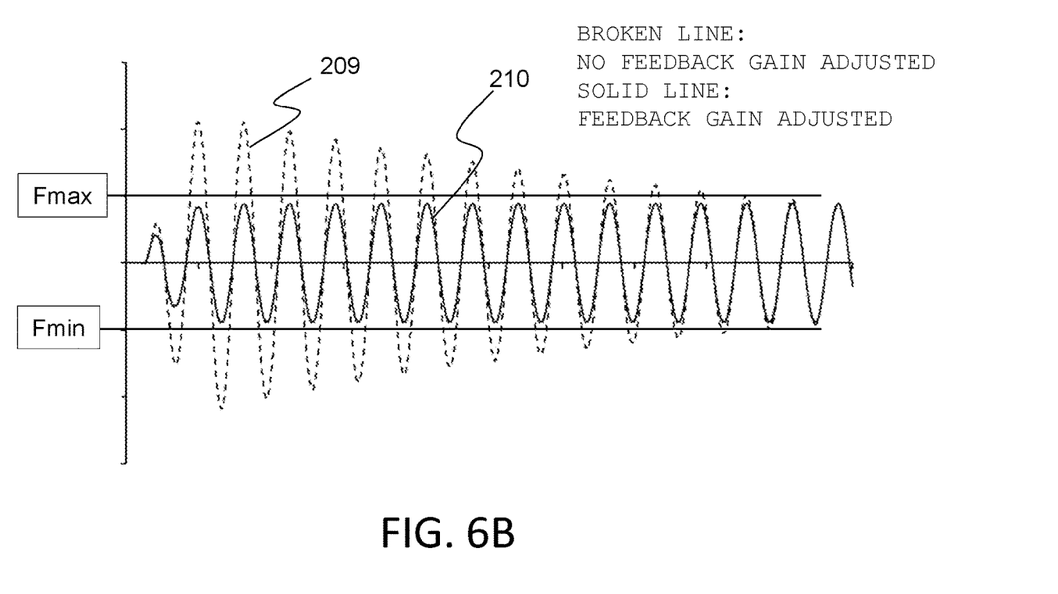
FIG. 6B is graph illustrating an example of a change in the output signal to a vibration damping mechanism 21 due to the change in a feedback gain value K.

FIG. 6A illustrates a waveform 208 representing a change in the feedback gain value K at each time, where the vertical axis represents the feedback gain value and the horizontal axis represents time.

As can be seen from the waveform 208, the feedback gain value K at each time is calculated using [Expression 4] on the basis of the instantaneous amplitude of the output signal to the vibration damping mechanism 21, and the maximum output value $F_{max}$ and the minimum output value $F_{min}$ stored in the maximum output value/minimum output value storage unit 28. The instantaneous amplitude of the output signal to the vibration damping mechanism 21 is calculated by multiplying the estimated value 207 of the instantaneous amplitude of the column collapse primary mode at each time by the gain value of the calculation gain control unit 26.

FIG. 6B illustrates the waveform 210 of the output signal to the vibration damping mechanism 21 adjusted by the feedback gain value calculation unit 27, where the vertical axis represents the voltage value and the horizontal axis represents time.

From FIGS. 6A and 6B, when the output signal 209 to the vibration damping mechanism 21 in a case where the feedback gain value K is not adjusted becomes larger than the maximum output value $F_{max}$ of the vibration damping mechanism 21, the feedback gain value K is adjusted, and the output signal to the vibration damping mechanism 21 is adjusted so as not to exceed the maximum output value $F_{max}$ and not to fall below the minimum output value $F_{min}$. As a result, it can be seen that the time-series waveform 210 of the output signal to the vibration damping mechanism 21 in a case where the feedback gain value K is adjusted falls within the range of the minimum output value $F_{min}$ to the maximum output value $F_{max}$ of the vibration damping mechanism 21. As the feedback gain value K increases with the attenuation of the vibration of the column 2, a high gain is achieved within the range of $F_{max}$ and $F_{min}$, so that the maximum damping effect according to the performance of the vibration damping mechanism 21 can be obtained at each time.

As described above, according to the first embodiment, it is possible to provide the vibration damping system for the charged particle beam apparatus capable of performing appropriate damping control according to the situation of the device and the performance of the vibration damping mechanism.

Figure 7:
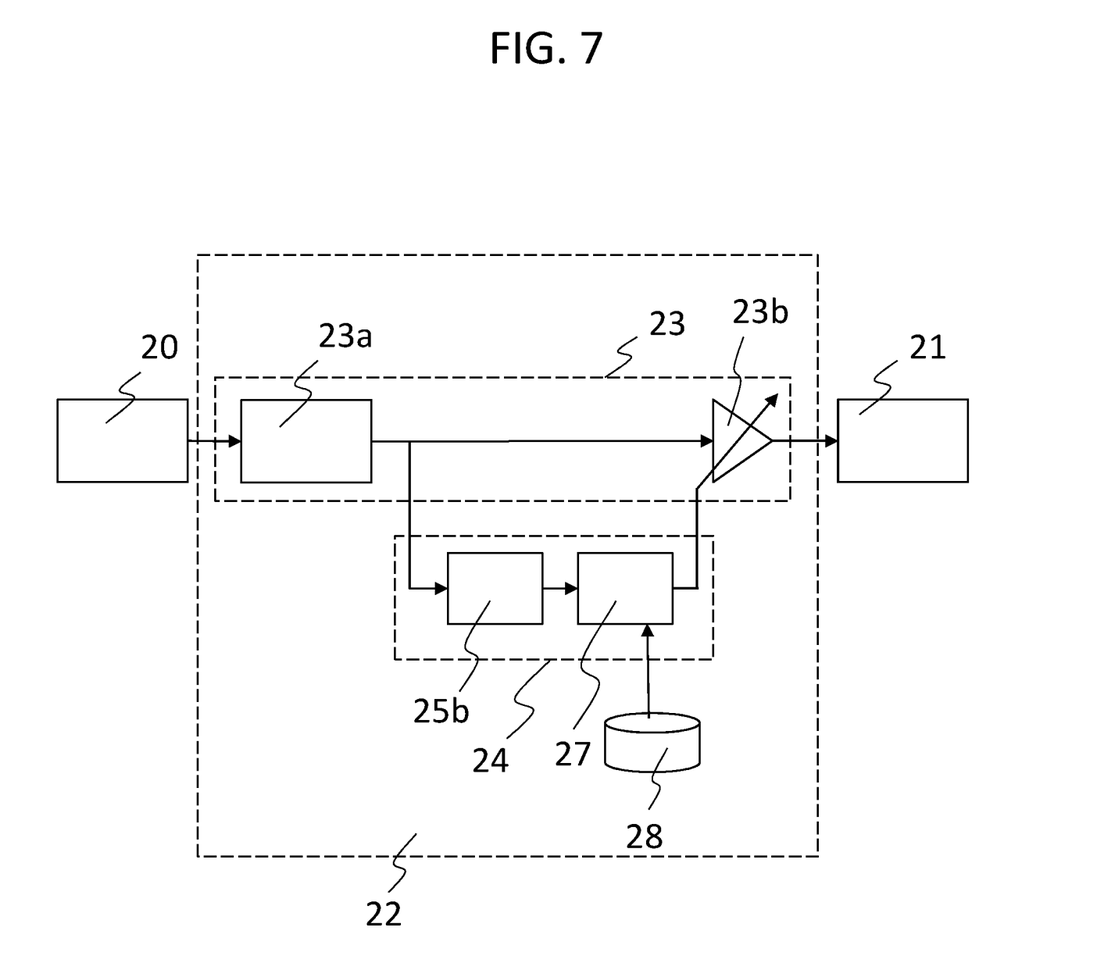
FIG. 7 is a block diagram for explaining a vibration damping system (vibration suppression system) for a charged particle beam apparatus according to a second embodiment and a charged particle beam apparatus including such a vibration damping system.

Second Embodiment a vibration damping system (vibration suppression system) for a charged particle beam apparatus according to a second embodiment and a charged particle beam apparatus including such a vibration damping system will be described with reference to FIG. 7. Since the overall configuration of the charged particle beam apparatus and the overall configuration of the vibration damping system are similar to those of the first embodiment, redundant description will be omitted. FIG. 7 is a block diagram illustrating details of the control device 22 according to the second embodiment. The same parts as those in FIG. 3 are denoted by the same reference numerals, and redundant description will be omitted.

In FIG. 7, it is possible to estimate the instantaneous amplitude of the output signal to the vibration damping mechanism 21 and adjust the feedback gain. In FIG. 7, the filter processing unit 25a and the calculation gain control unit 26 are omitted, and instead, the instantaneous amplitude calculation unit 25b estimates the instantaneous amplitude of the output signal to the vibration damping mechanism 21 according to the output signal from the controller 23a. This can simplify the configuration of the system and facilitates the add-on.

The invention is not limited to the above embodiments, but includes various modifications other than the above. For example, the above-described embodiments of the invention have been described in detail in a clearly understandable way, and are not necessarily limited to those having all the described configurations. In addition, some of the configurations of a certain embodiment may be replaced with the configurations of the other embodiments, and the configurations of the other embodiments may be added to the configurations of the subject embodiment. In addition, some of the configurations of each embodiment may be omitted, replaced with other configurations, and added to other configurations.

What is claimed is:

1. A vibration damping system for a charged particle beam apparatus, comprising:
a column through which a charged particle beam passes;
a vibration detection unit configured to detect vibration of the column;
a damping mechanism configured to apply vibration to the column to suppress vibration of the column; and
a control device configured to control the damping mechanism,
wherein the control device includes:
a damping gain control unit that amplifies a detection signal of the vibration detection unit with a set amplification factor and outputs an amplified detection signal to the damping mechanism as a control signal; and
a saturation suppression unit that adjusts a feedback gain value of the damping gain control unit according to a detection signal of the vibration detection unit, a signal of the damping mechanism, and a maximum output value and a minimum output value of the damping mechanism.

2. The vibration damping system according to claim 1, wherein the saturation suppression unit is configured to sequentially update the feedback gain value based on a signal of the vibration detection unit and a maximum output value and a minimum output value of the damping mechanism.

3. The vibration damping system according to claim 1, wherein the saturation suppression unit configures the feedback gain value based on a magnitude relationship between an absolute value of a difference between the maximum output value and the minimum output value of the damping mechanism and an instantaneous amplitude of an output signal to the damping mechanism.

4. The vibration damping system according to claim 1, wherein the saturation suppression unit includes a filter processing unit that filters a signal of a predetermined frequency among signals of the vibration detection unit.

5. The vibration damping system according to claim 4, wherein the filter processing unit extracts a signal related to a column collapse primary mode related to collapse of the column in one direction.

* * * * *